United States Patent

Haghiri-Tehrani et al.

[11] Patent Number: 5,834,755
[45] Date of Patent: Nov. 10, 1998

[54] ELECTRONIC MODULE AND A DATA CARRIER HAVING AN ELECTRONIC MODULE

[75] Inventors: Yahya Haghiri-Tehrani, München; Renee-Lucia Barak, Unterhaching, both of Germany

[73] Assignee: Giesecke & Devrient GmbH, Munich, Germany

[21] Appl. No.: 567,458

[22] Filed: Dec. 5, 1995

[30] Foreign Application Priority Data

Dec. 8, 1994 [DE] Germany ............ 44 43 767.6

[51] Int. Cl.$^6$ .................................. G06K 19/00
[52] U.S. Cl. ............ 235/492; 235/488; 257/669
[58] Field of Search .................. 235/488, 497; 257/669, 679, 680, 674, 684

[56] References Cited

U.S. PATENT DOCUMENTS

| | | | |
|---|---|---|---|
| 4,463,971 | 8/1984 | Hoppe et al. | 235/492 |
| 4,586,379 | 5/1986 | Manfredi | 494/10 |
| 4,737,620 | 4/1988 | Mollet et al | 235/492 |
| 4,841,134 | 6/1989 | Hida et al. | 235/492 |
| 4,897,534 | 1/1990 | Haghiri-Tehrani | 235/492 |
| 5,005,282 | 4/1991 | Rose | 235/492 |
| 5,013,900 | 5/1991 | Hoppe | 235/492 |
| 5,027,190 | 6/1991 | Haghiri-Tehrani | 235/492 |
| 5,031,026 | 7/1991 | Ueda | 235/492 |
| 5,055,913 | 10/1991 | Haghiri-tehrani | 235/492 |
| 5,057,460 | 10/1991 | Rose | 437/217 |
| 5,057,679 | 10/1991 | Audic et al. | 235/492 |
| 5,208,450 | 5/1993 | Uenishi | 235/482 |
| 5,293,064 | 3/1994 | Yoshimoto et al. | 257/669 |
| 5,550,402 | 8/1996 | Nicklaus | 257/669 |
| 5,554,885 | 9/1996 | Yamasaki et al. | 257/669 |

FOREIGN PATENT DOCUMENTS

| | | |
|---|---|---|
| 0 527 438 | 2/1993 | European Pat. Off. . |
| 0075986 | 4/1986 | Japan ............ 235/492 |

OTHER PUBLICATIONS

Patent Abstract of Japan; Publication No. 02030598 (Jan. 1990); Japanese Patent Application No. 63181309 filed Jul. 20, 1988.

*Primary Examiner*—Anita Pellman Gross
*Assistant Examiner*—Douglas X. Rodriguez
*Attorney, Agent, or Firm*—Bacon & Thomas PLLC

[57] ABSTRACT

A lead frame module to be incorporated in data carriers is presented which is divided into two areas, namely a central area receiving the sensitive components of the module, and an outer area protruding beyond the edge of the central area and serving to glue the lead frame module to the data carrier. To prevent forces from being transmitted from the outer area of the electronic module to the central area upon bending loads of the data carrier, the outer area is decoupled mechanically from the central area. This can be done for example by providing partial discontinuities including relieving punchings in the transition between the central and outer area.

25 Claims, 4 Drawing Sheets

ELECTRONIC MODULE AND A DATA CARRIER HAVING AN ELECTRONIC MODULE

BACKGROUND OF THE INVENTION

This invention relates to an electronic module having a metal layer in which a contact layout with mutually insulated contact surfaces is formed by interruptions, and having two areas, namely a central area containing an integrated circuit and conductive connections from the circuit to the contact surfaces, the circuit and connections being surrounded by a casting compound, and an outer area largely free from casting compound. The invention relates further to a data carrier having such an electronic module.

Electronic modules with the above mentioned structure are known e.g. from U.S. Pat. No. 5,005,282 and are generally designated lead frame modules. For producing the modules known from U.S. Pat. No. 5,005,282 a metal band (lead frame) is provided in which a contact layout with mutually insulated contact surfaces is produced, the contact surfaces initially remaining connected with the metal band by bars. After that adhesive strips are applied to the outer areas of the contact layout, and an integrated circuit in the remaining central area, the circuit being connected electrically with the contact surfaces. Then the circuit and conductive connections are cast with a compound for protection from mechanical loads. Finally the module is separated from the metal band.

The module thus has two areas, namely an outer area formed mainly by the contact layout, and a central area containing the integrated circuit and conductive connections from the circuit to the contact surfaces. The adhesive strips located on the outer area are used to glue the module into an accordingly adapted gap in a data carrier provided.

The completed data carriers are used e.g. as telephone cards, bank cards, etc., and are exposed to strong mechanical loads in daily use, particularly bending loads. The mechanical loads can be transmitted from the outer area to the central area of the module and lead there for example to breakage of the integrated circuit or a break in the conductive connections from the circuit to the contact surfaces, and thus to functional failure of the data carrier. The latter can happen e.g. if bending loads cause the casting compound of the module to work loose at the transition from the outer to the inner areas, since an insufficient connection between the casting compound and the contact layout exists there.

OBJECTS OF THE INVENTION

The problem of the invention is therefore to propose a lead frame module to be incorporated in a data carrier, which is protected well from mechanical loads during daily use of the data carrier.

SUMMARY OF THE INVENTION

The basic idea of the invention is to be seen in that the central area of the electronic module, which receives the sensitive components and is relatively rigid due to the casting compound, is largely decoupled mechanically from the outer area of the module, which consists exclusively of the carrier. This can be obtained, for example, by furnishing the transition area of the module between the central area and the outer area with partial discontinuities such as punchings or perforations.

The advantages achieved with the invention are to be seen in particular in that one obtains a lead frame module which withstands even strong bending loads. The module can be manufactured simply and practically without additional effort since the relieving punchings or perforations, etc., in the outer area of the module can already be produced during production of the contact layout or else when punching through the bars initially connecting the contact layout with the metal band. Finally the inventive module can be inserted in the data carrier and fastened there with no change in the incorporation methods.

According to an embodiment of the invention, during production of the contact layout in the metal band partial discontinuities such as windows are simultaneously produced in the transition area thereof. The position of the windows is chosen so that they are in close proximity to the central area or the casting compound of the module when the module is completed. This obtains a virtually optimal decoupling between the outer area serving to glue the module in the data carrier, and the central area of the module containing the sensitive components.

According to a first development of the invention the metal band is subjected to a special pretreatment permitting a better bond to be obtained between the contact layout and the casting compound, so that the casting compound does not work loose from the contact layout as quickly due to bending loads of the data carrier. This can be done for example through a plasma pretreatment or a sandblasting treatment.

According to a further development of the invention the electronic module is glued to the data carrier with the help of a flexible adhesive layer which can largely absorb mechanical loads occurring upon bending loads of the data carrier.

BRIEF DESCRIPTION OF THE DRAWINGS

Further embodiments and advantages of the invention will be explained in connection with the following figures, in which.

DETAILED DESCRIPTION

Figure 1:
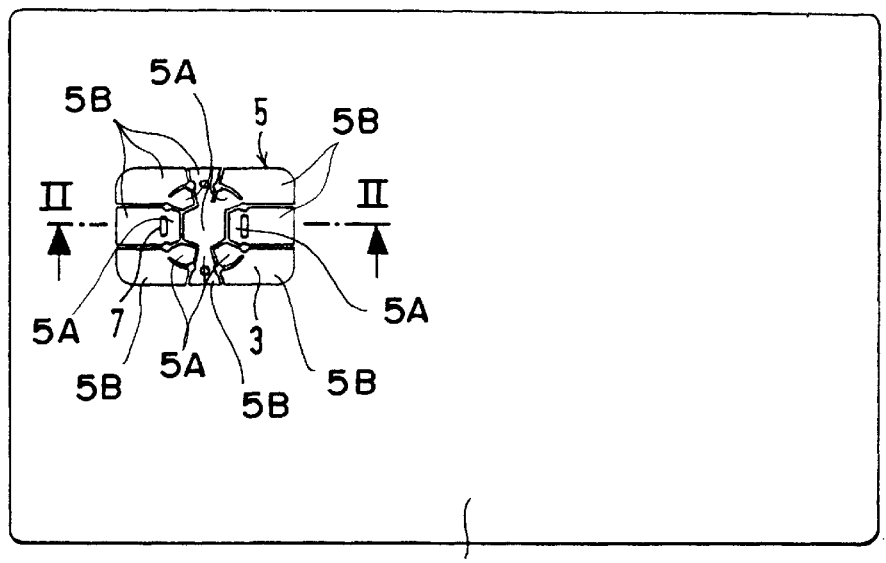
FIG. 1 shows a data carrier with a lead frame module in plan view.

FIG. 1 shows, enlarged and not true to scale, data carrier 1 with inventive electronic module 3 in plan view. In the metal layer of the electronic module a contact layout with contact surfaces 5 is formed by interruptions. Within contact surfaces S individual windows 7 are provided, whose function will be explained in connection with FIG. 2.

Figure 2:
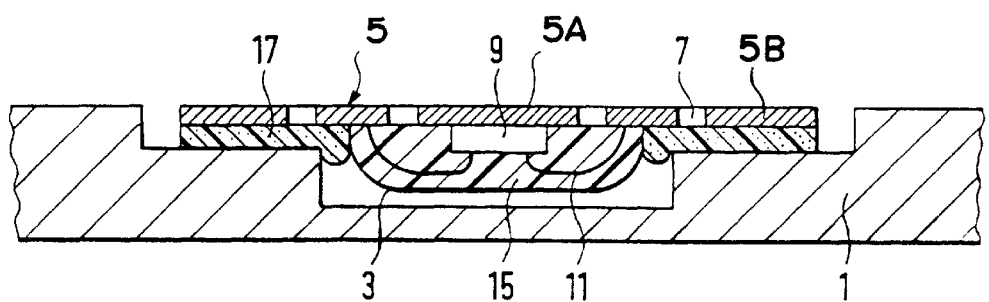
FIG. 2 shows the data carrier of FIG. 1 in cross section taken along line II—II in FIG. 11.

FIG. 2 shows a cross section along line II—II shown in FIG. 1. Electronic module 3 can be divided into two areas, namely a central area 5A and an outer area 5B. In the central area integrated circuit 9 is applied, being connected electrically with contact surfaces 5 e.g. by means of bonding wires 11. For protection from mechanical loads, integrated circuit 9 and bonding wires 11 are cast round with compound 15. The central area 5A thus contains the sensitive components of electronic module 3 (namely the integrated circuit and the conductive connections from the circuit to the contact surfaces) and is relatively rigid.

The outer area 5B of module 3 consists exclusively of the thin metal layer and serves to connect the module with the data carrier. For this purpose e.g. adhesive layer 17 is applied to this area with the help of which electronic module 3 is glued in a gap in the data carrier, as shown in FIG. 2. Adhesive layer 17 protrudes partly onto casting compound 15 and seals the gap containing module 3 from the outside. This prevents air from penetrating into the gap, for example through the interruptions in the contact layout or through windows 7.

As indicated by FIG. 2, the rigid central area is largely decoupled mechanically from the outer area, which is done in the embodiment shown by windows 7 located in the transition between the central and outer area. Very good decoupling is guaranteed if the windows are located as close as possible to the central area 5A. The decoupling of the areas means that mechanical loads acting on the outer area 5B, e.g. upon bending of the data carrier, are only transmitted to the central area 5A to a small extent. This eliminates e.g. the danger of casting compound 15 working loose from the contact layout in the central area and bonding wires 11 thereby working loose from the contact surfaces.

In connection with FIG. 2 it was explained that the electronic module is glued in the gap of a data carrier provided. This incorporation technique is generally designated the mounting approach. The module can of course also be inserted in the card body of the data carrier in a different way, e.g. by introducing the module into a layer structure and connecting the layers under the action of heat and pressure (laminating technique), or by introducing the module into an injection mold and producing the data carrier by injecting plastic material into the cavity of the casting mold (injection molding technique).

Regardless of how the module is inserted in the data carrier, it is especially advantageous if the relieving areas of the module (embodied by windows 7 in FIG. 2) remain virtually free from data carrier material. Filling the relieving areas with data carrier material would counteract the mechanical decoupling of the two areas of the module.

Figure 3:
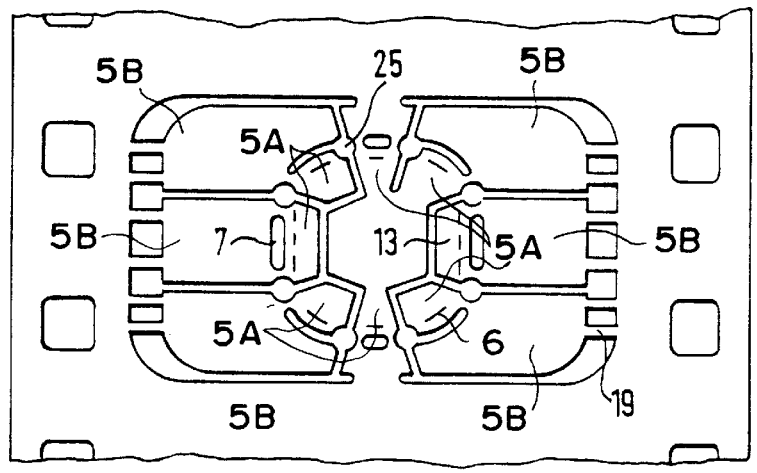
FIG. 3 shows a metal band with a contact layout in plan view.
Figure 4:
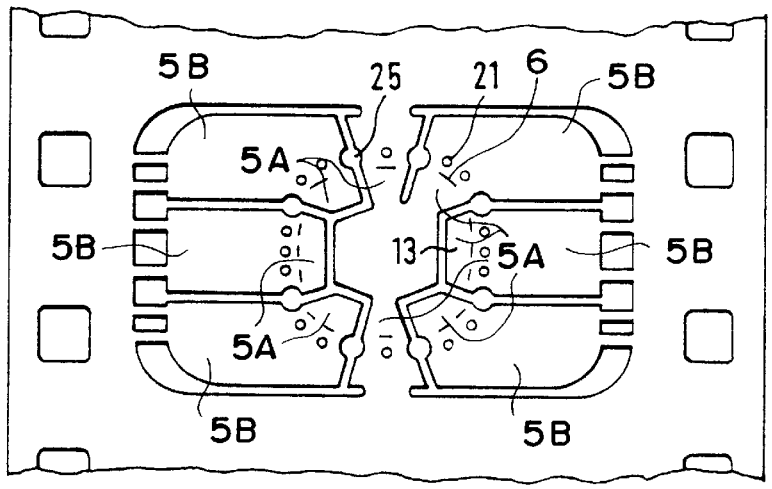
FIG. 4 shows a metal band with a contact layout in plan view.
Figure 5:
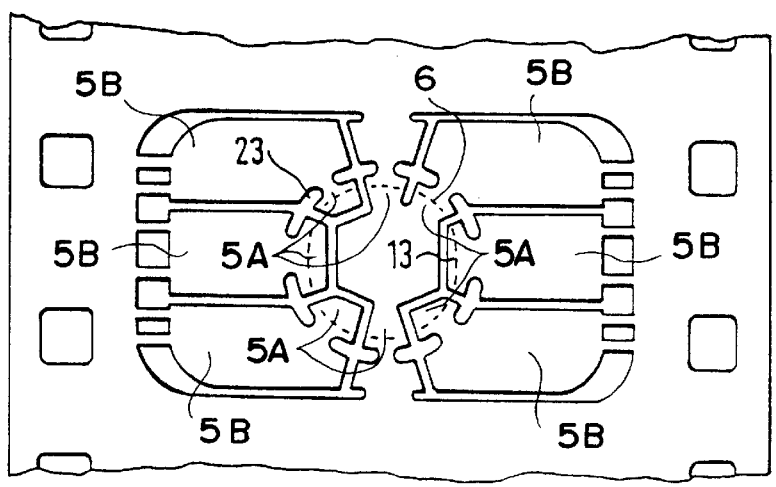
FIG. 5 shows a metal band with a contact layout in plan view.

FIGS. 3 to 5 each show a metal band with a contact layout in plan view.

Contact layouts are first produced in the metal band equidistantly, e.g. by punching or etching, etc., and initially remain connected with the metal band by bars 19. The contact layout is preferably designed so that part 13 of contact surfaces 5 which is located on the casting compound in the central area 5A when the module is completed, has as large a surface as possible so as to guarantee a good bond between this part of the contact surfaces and the casting compound. At the same time as the contact layout is produced, or in a separate method step, the cross-sectional area of contact surfaces 5 as viewed along a section line extending from the central to the outer areas of the contact surfaces is reduced by partial discontinuities in the transition area between central and outer areas 5A and 5B, respectively. Done in close proximity to the central area, which is indicated by dash lines 6 in FIGS. 3 to 5, since this obtains an especially good mechanical decoupling of the areas. With the contact layout shown in FIG. 3 the cross-sectional area is reduced by providing windows 7 in contact surfaces 5 in transition area, which were explained above in connection with FIGS. 1 and 2. With the contact layout shown in FIG. 4 the corresponding transition area is perforated, as indicated by perforations 21. With the contact layout shown in FIG. 5 the cross-sectional area is reduced by partial discontinuities in the form of indentations 23 extending from the interruptions between contact surfaces 5 into the latter so that only a narrow bar remains between the outer area 5B and part 13 of the contact surfaces which is located in the central area 5A.

The discontinuities provided by the windows and the perforations or indentations in the transition areas obtain a mechanical decoupling of the outer area 5B from the central area 5A. This list of embodiments is not exhaustive; other possibilities of decoupling are also conceivable without departing from the inventive principle.

FIGS. 3 and 4 show besides windows 7 or perforations 21 additional windows 25, which need not necessarily be present and whose function will be explained in connection with FIG. 7.

Figure 6:
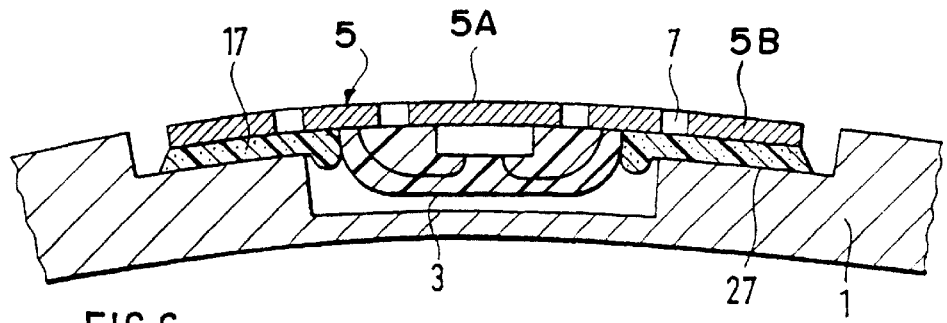
FIG. 6 shows a bent data carrier in cross section.

FIG. 6 shows a cross section along line A—A shown in FIG. 1 through a data carrier having an inventive lead frame module, whereby the data carrier is being subjected to a bending load. To improve the decoupling between the rigid central area 5A and the outer area 5B further, adhesive layer 17 can be of flexible design. This can be obtained e.g. by a paper web impregnated with thermally activated adhesive. The flexibility of adhesive layer 17 causes bending forces attacking shoulder 27 to be absorbed by adhesive layer 17, which leads to a shearing of adhesive layer 17, as indicated in FIG. 6. This relieves the central area of the module additionally.

However there are also a number of other possibilities for making adhesive layer 17 flexible. Adhesive layer 17 can thus be a layer of flexible material which is impregnated with an adhesive (e.g. contact adhesive or thermally activated adhesive). The flexible material can be for example a paper web or else polyurethane foam.

Adhesive layer 17 can have, in addition to the layer of flexible material impregnated with the adhesive, a second layer consisting of a second adhesive. The first and second adhesives are then chosen so that one of them connects optimally with the electronic module and the other connects optimally with the data carrier.

Such a two-layer adhesive layer 17 could look for example as follows. The layer consisting of flexible material is impregnated with a contact adhesive. Disposed on this layer is an additional layer of thermally activated adhesive which is glued to the first layer by the contact adhesive of the first layer. Two-layer adhesive layer 17 with this design is disposed in the data carrier in such a way that the layer of flexible material impregnated with contact adhesive is glued to the data carrier, while the layer of thermally activated adhesive is glued to contact surfaces 5 of the electronic module.

Figure 10:
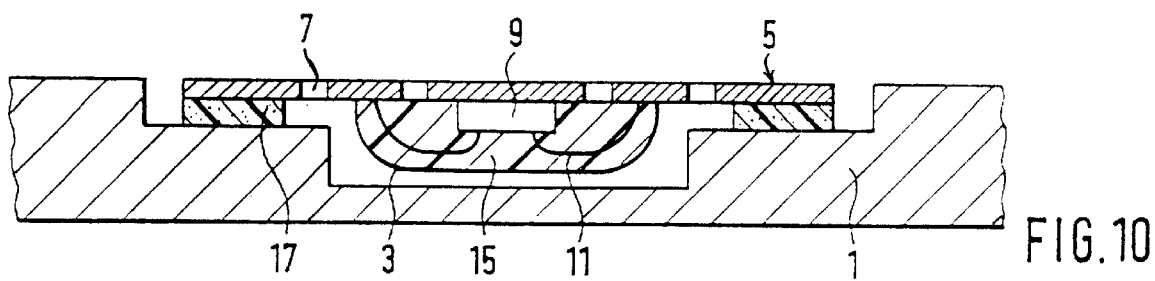
FIG. 10 shows a data carrier in cross section.

The central area can also be relieved additionally if the relieving areas of the electronic module (i.e. the areas where windows 7, perforations, etc., are located) are not underlaid by an adhesive layer. This can be realized for example by producing in adhesive layer 17 a window so large that both the central area of the electronic module and the relieving areas are located therein, as shown in FIG. 10. An adhesive layer prepared in such a way can of course also be of flexible design.

Figure 7:
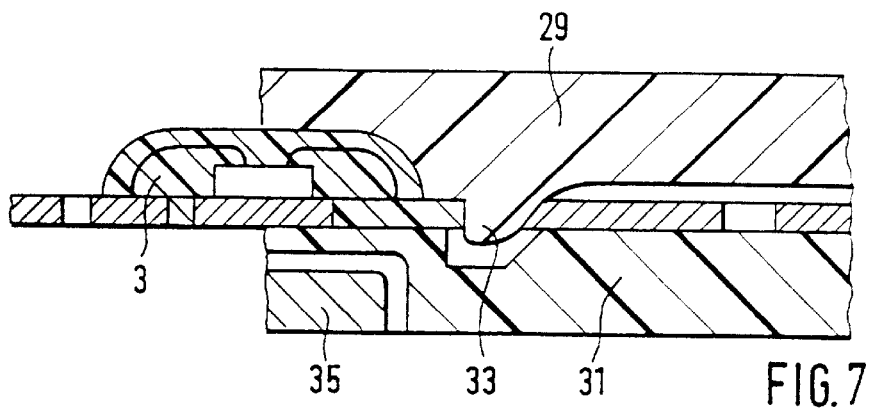
FIG. 7 shows a lead frame module in a casting mold.

FIG. 7 shows electronic module 3 in a casting mold which consists of two halves 29 and 31. Module 3 is cast round with a compound therein, which can be done either by casting or by injection molding. To prevent casting compound from leaking out of the mold cavity through the interruptions in the contact layout during the casting process, mold half 29 contains projections 33 which engage additional windows 25 (see e.g. FIG. 3) and seal the mold cavity accordingly. Magnet 35 can additionally be provided in mold half 31, being activated before the casting process and attracting the contact layout, which in this case consists of a magnetic metal or is coated with a magnetic material, and improving its flatness against the wall of mold half 31. In this way one can virtually prevent casting compound from penetrating through the interruptions in the contact layout onto the side of the contact layout opposite circuit 9 and contaminating the external contact surfaces.

Additionally or alternatively it is also possible to cover the external contact surfaces with a foil before the casting process to protect them from contamination and to remove this foil afterwards.

Should the external contact surfaces nevertheless be contaminated during manufacture, they can of course also be carefully cleaned.

Figure 11:
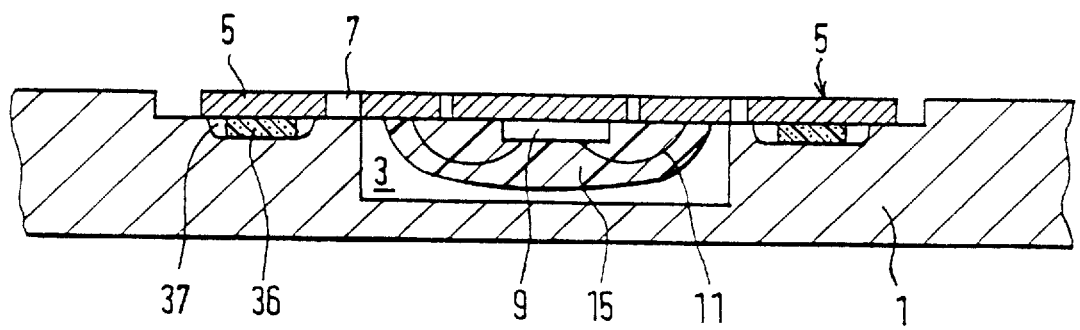
FIGS. 11 and 12 show developments of a data carrier according to FIGS. 1, 2, 6 and 10 in cross section.

FIG. 11 shows a development of the data carrier according to FIGS. 1, 2, 6 and 10 in cross section. The difference between the data carrier according to FIG. 11 and the data carrier of FIGS. 1, 2, 6 and 10 is to be seen substantially in that electronic module 3 is glued to data carrier 1 by liquid adhesive 36. To prevent the liquid adhesive from spreading beyond the contours of contact surfaces 5 when electronic module 3 is glued to data carrier 1, the data carrier has means in the form of depressions 37 which are each located within the contour of individual contact surfaces 5 and thus have a surrounding wall. To glue electronic module 3 to the data carrier, a drop of liquid adhesive 36 is poured into depressions 37, and module 3 then inserted in the gap in data carrier 1. Owing to depressions 37 the adhesive cannot escape.

Figure 12:
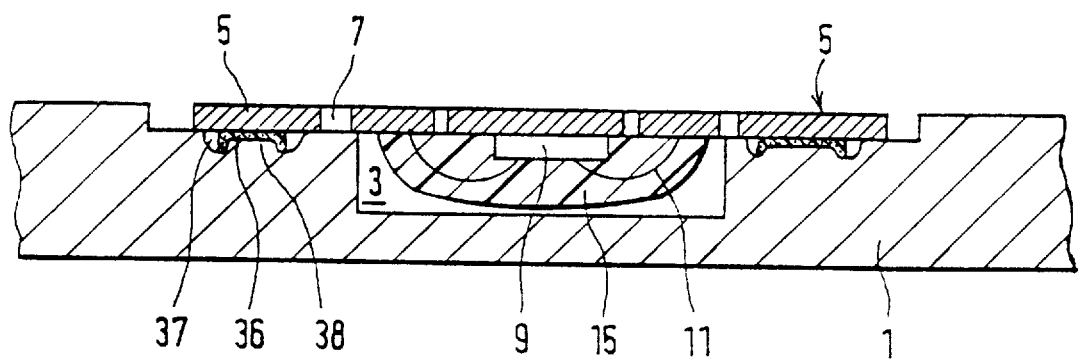

FIG. 12 shows a development of the data carrier according to FIG. 11 in cross section. The data carrier differs from that in FIG. 11 in that depressions 37 have additional bumps 38 in an inner area. This makes it possible for electronic module 3 and data carrier 1 to be glued together by a thin film of liquid adhesive 36 so that a better adhesive effect is achieved between the module and the data carrier. The surplus adhesive can flow off into the channel arising between depressions 37 and bumps 38.

Figure 8:
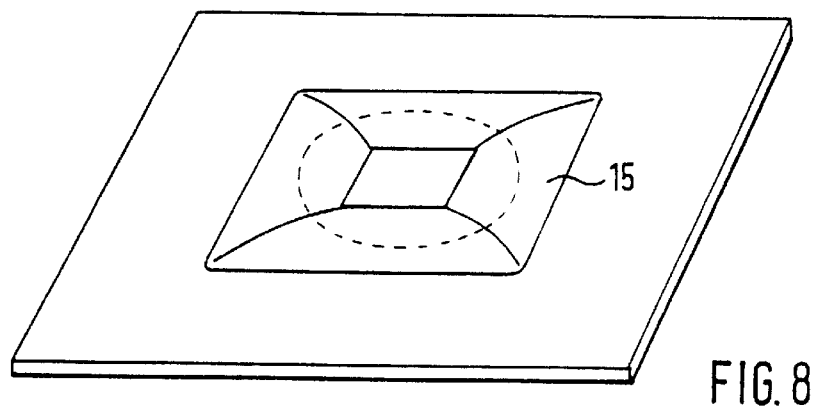
FIG. 8 shows a lead frame module.
Figure 9:
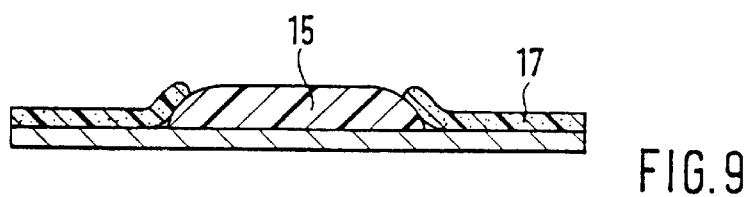
FIG. 9 shows the lead frame module from FIG. 8 with an applied adhesive layer.

Finally it should be mentioned that it is especially advantageous to give casting compound 15 a "crowned" form, as indicated in FIG. 8, since in this case the outer area of the electronic module can be provided with adhesive layer 17 which has a circular window and protrudes partly onto the casting compound, as shown in FIG. 9. An adhesive layer protruding onto the casting compound permits large-surface gluing of the module in the data carrier, as also shown in FIGS. 2 and 6. Further advantages of an adhesive layer formed in such a way are to be found in EP 0 493 738 A1.

We claim:

1. An electronic module comprising: a metal layer in which a contact layout with mutually insulated contact surfaces is formed by interruptions, said contact layout having two areas, namely a central area to which an integrated circuit is attached and conductive connections from the circuit to the contact surfaces, the circuit and connections being surrounded by a casting compound, and an outer area largely free from casting compound, the transition between said central area and said outer area of each contact surface being partially discontinuous such that said two areas are largely decoupled mechanically from each other so that mechanical loads acting on the outer area are not fully transmitted to the central area.

2. The electronic module of claim 1, wherein the cross-sectional area of the contact surfaces located in the transition is reduced in the vicinity of the central area to form the partial discontinuities.

3. The electronic module of claim 2, wherein said cross-sectional area is reduced by windows located in the contact surfaces.

4. The electronic module of claim 2, wherein said cross-sectional area is reduced by perforations located in the contact surfaces.

5. The electronic module of claim 2, wherein said cross-sectional area is reduced by indentations protruding into the contact surfaces and extending from the interruptions forming the contact surfaces.

6. The electronic module of claim 1, wherein at least the central area of the contact layout is pretreated so as to improve the bond between the casting compound and the contact layout metal.

7. The electronic module of claim 1, wherein the casting compound has a crowned form in the central area.

8. A data carrier comprising data carrier material, an electronic module supported by the data carrier material, the electronic module having a metal layer in which a contact layout with mutually insulated contact surfaces is formed by interruptions, said contact layout having two areas, namely a central area to which an integrated circuit is attached and conductive connections from the circuit to the contact surfaces, the circuit and connections being surrounded by a casting compound, and an outer area connected to the data carrier material largely free from casting compound, the transition between said central area and said outer area of each contact surface being partially discontinuous such that said two areas are largely decoupled mechanically from each other so that mechanical loads acting through the data carrier material on the outer area are not fully transmitted to the central area.

9. The data carrier of claim 8, including relieving areas in the transition forming the partial discontinuities, and wherein at least the relieving areas are largely free from data carrier material.

10. The data carrier of claim 9, wherein the electronic module is secured in a gap in the data carrier material with a flexible adhesive.

11. The data carrier of claim 10, wherein the flexible adhesive comprises a layer of flexible material impregnated with adhesive.

12. The data carrier of claim 11, wherein the flexible adhesive has, in addition to the layer of flexible material with the first adhesive, a second layer comprising a second adhesive, wherein one of the adhesives connects well with the electronic module and the other adhesive connects well with the data carrier.

13. The data carrier of claim 9, wherein the electronic module is glued into a gap in the data carrier by a liquid adhesive, means being provided in the data carrier for preventing the liquid adhesive from spreading beyond the contours of the individual contact surfaces of the electronic module during gluing.

14. The data carrier of claim 13, wherein the means for preventing liquid adhesive from spreading comprises depressions in the data carrier material which are each located within the outer contours of the individual contact surfaces.

15. The data carrier of claim 14, wherein the depressions include a depressed area and a bump in the depressed area, a channel around the bump in the depressed area, whereby when the electronic module and data carrier are secured together by a thin film of liquid adhesive placed on the bump, surplus adhesive can flow off into the channel.

16. A method for producing an electronic module, the method comprising the following steps:

providing a metal band in which a contact layout with contact surfaces for one module each is formed by interruptions, said layout initially remaining connected with the metal band by bars and including a central and outer area, producing partial discontinuities in the contact layout in the transition area between said central and outer areas of each contact surface for largely mechanically decoupling the central area from the outer area in the completed module, attaching an integrated circuit to the central area of the central layout producing conductive connections from the integrated circuit to the contact surfaces, introducing the integrated circuit and conductive connections into a casting mold having mold sections, closing the casting mold in such a way that the outer area of the contact surfaces are clamped between the mold sections, and, filing the cavity of the casting mold with a casting compound.

17. The method for producing an electronic module of claim 16, wherein the partial discontinuities are produced in the contact layout simultaneously with the production of the contact layout.

18. The method for producing an electronic module of claim 16, wherein the partial discontinuities in the contact layout are produced after the casting of the central area.

19. The method for producing an electronic module of claim 16, wherein the contact layout is produced by punching, and the partial discontinuities are simultaneously formed by punching into the contact surfaces.

20. The method of claim 16, wherein at least the central area of the contact layout is pretreated so as to improve the bond between the applied casting compound and the contact layout metal.

21. The method for producing an electronic module of claim 20, wherein the pretreatment is done with plasma.

22. The method for producing an electronic module of claim 20, wherein the pretreatment is done by sandblasting.

23. The method for producing an electronic module of claim 16, wherein one of the casting mold halves has projections which engage the interruptions in the contact layout and thereby seal the mold cavity when the mold is closed.

24. The method for producing an electronic module of claim 16, wherein the mold cavity is defined by a wall and the part of the metal band located in the cavity of the casting mold is pressed against the wall of the cavity to prevent the casting compound from overflowing onto the surface of the metal band lying against the wall.

25. The method of claim 24, wherein the pressing is done by a magnet disposed in the casting mold and attracting the metal band.

\* \* \* \* \*